(12) United States Patent
Daemen et al.

(10) Patent No.: US 6,624,027 B1
(45) Date of Patent: Sep. 23, 2003

(54) ULTRA SMALL THIN WINDOWS IN FLOATING GATE TRANSISTORS DEFINED BY LOST NITRIDE SPACERS

(75) Inventors: Eleonore Daemen, Trets (FR); Alan L. Renninger, Cupertino, CA (US); Bohumil Lojek, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 10/143,225

(22) Filed: May 9, 2002

(51) Int. Cl.⁷ .............................. H01L 21/336
(52) U.S. Cl. ................ 438/264; 257/321; 438/257; 438/263
(58) Field of Search ................ 257/321; 438/257–267

(56) References Cited

U.S. PATENT DOCUMENTS

| | | | |
|---|---|---|---|
| 5,108,939 A | 4/1992 | Manley et al. | 437/43 |
| 5,352,618 A | 10/1994 | Larsen et al. | 437/43 |
| 5,516,713 A | 5/1996 | Hsue et al. | 437/43 |
| 5,953,254 A * | 9/1999 | Pourkeramati | 365/185.26 |
| 6,156,610 A | 12/2000 | Rolandi | 438/258 |
| 6,174,771 B1 | 1/2001 | Leu | 438/257 |
| 6,255,172 B1 | 7/2001 | Huang et al. | 438/266 |
| 6,316,316 B1 | 11/2001 | Wu | 438/260 |
| 6,369,422 B1 | 4/2002 | Lojek | 257/321 |

OTHER PUBLICATIONS

D. Frohman–Bentchkowsky, "A Fully Decoded 2048–Bit Electrically Programmable", IEEE Journal of Solid–State Circuits, Oct. 1971, pp. 146–151.

* cited by examiner

*Primary Examiner*—Kamand Cuneo
*Assistant Examiner*—Asok Kumar Sarkar
(74) *Attorney, Agent, or Firm*—Thomas Schneck (57) ABSTRACT

A tiny tunnel oxide window with dimensions smaller than the minimum feature resolution of the process equipment is formed in an EEPROM structure by placing dummy nitride spacers on either side of a nitride implant mask over a gate oxide layer after source and drain are formed by implantation at opposed sides of the nitride mask. The spacers are formed in a second nitride layer deposit after the nitride mask formation. The spacers are etched to have a desired tunnel oxide dimension. Another oxide layer is deposited over one of the source and drain regions, abutting a nitride spacer. The nitride layers are removed leaving a spacer nest, into which tunnel oxide is deposited. The device is finished in the usual way for an ESPROM structure.

12 Claims, 8 Drawing Sheets

ULTRA SMALL THIN WINDOWS IN FLOATING GATE TRANSISTORS DEFINED BY LOST NITRIDE SPACERS

TECHNICAL FIELD

The invention relates to floating gate, nonvolatile, electrically alterable memory cells, and in particular to a memory cell with ultra-small dimensions and a method of making same.

BACKGROUND ART

Floating gate semiconductor nonvolatile memory cells, known as EEPROMs for electrically erasable programmable read only memories or EPROMs for erasable programmable read only memories, were invented over 30 years ago. They typically employ a very thin oxide window, i.e. a dielectric, in a MOS memory cell transistor to allow charge transfer through the thin window to and from between a drain or source electrode located in a substrate region and a floating gate located above the substrate. The floating gate is so named because it is not electrically connected to any electrode, but is surrounded by dielectric material, including the thin oxide window. This charge transfer phenomenon is a remarkable occurrence, called "tunneling", a quantum mechanical behavior in which electric charge passes through the thin dielectric oxide window to reach the floating gate but yet conduction in the usual meaning of that term, cannot occur in the dielectric material at the relatively low voltages under consideration. The logic state of the memory cell is determined by the presence or absence of charge on the floating gate which stores the charge until it is erased.

In U.S. Pat. No. 5,108,939, a floating gate region is formed in the conventional manner above a gate dielectric layer. The drain region is exposed utilizing photolithographic techniques and the gate dielectric removed. A thin layer of tunnel dielectric is then formed on the exposed drain region. A thin layer of polycrystalline silicon is then formed and etched in order to create very narrow floating gate extensions of polycrystalline silicon along the edge of the previously formed floating gate. The floating gate extension formed in this manner is separated from the drain region by thin tunnel dielectric. Another dielectric layer is then formed to provide a dielectric over the drain region which has a greater thickness than the tunnel dielectric underlying the floating gate extension. The patent teaches a method of self-aligning the tunnel oxide to the floating gate and achieving submicron dimensions for the tunnel oxide, i.e. less than the characteristic linewidth dimension of manufacturing equipment. U.S. Pat. No. 6,156,610 to P. Rolandi describes formation of a select transistor simultaneously with formation of an EEPROM structure.

In prior patent application Ser. No. 09/847,810 of B. Lojek, now U.S. Pat. No. 6,369,422, granted Apr. 9, 2002, assigned to the assignee of the present invention, there is disclosed a method of making a nonvolatile memory cell structures wherein the size of the thin oxide window remains finite, but the part of the oxide window through which charge is transferred may be reduced to a size smaller than the minimum feature size resolution of the manufacturing equipment being used. This is accomplished by positioning the fixed-size oxide window in such a manner that its size is limited and whose position controls the amount of charge allowed to be transferred through it. The oxide window is constructed such that a first part of it lays over only one part of the two opposing field oxide regions and its remaining part lies over the channel region of a MOS transistor, but does not extend across it. This effectively creates a slit and the size of the slit may be adjusted by moving the position of the oxide window. Parts of the oxide window constructed over the field oxide region cannot be used to allow charge transfer to the floating gate. Only the part of the oxide window that lies over the channel region may be used to permit such charge transfer. Thus, one can construct an effective charge transfer region that is quite small, i.e. smaller than the minimum feature size of manufacturing equipment. A thin window is constructed which overlaps the field oxide and does not reach across the width of the channel. In this sense the thin window is asymmetric since symmetric thin windows completely reach across the width of the channel.

While small transistor size-is possible with this construction, as the thin window becomes smaller, the window must be protected from process steps that might erode quality. An object of the invention was to devise a small size thin window, i.e. smaller than the feature size of manufacturing equipment, yet is constructed in a manner that protects the quality of the window.

SUMMARY OF THE INVENTION

The above object is achieved by establishing thin tunneling windows in an early stage of an EEPROM fabrication process. Presently, the minimal characteristic dimension of the process equipment is limited by the minimum dimension which can be made by the use of photolithography. The present invention creates a thin window having a length or width which is actually less than this characteristic dimension of the fabrication process.

A nitride mask over a gate oxide layer on a substrate is used to first create self-aligned source and drain regions for an EEPROM memory cell. The nitride mask protects the future channel which will exist between source and drain electrodes. After formation of source and drain, a second nitride layer is deposited in which nitride spacers are formed on either side of the nitride mask and etched to a desired dimension having a length whose length will be the dimension of the tunnel oxide. Gate oxide is removed on one side of the nitride mask so that the dummy spacer on this side can approach the substrate. This dummy spacer has no purpose except to define the length of the future tunnel oxide window. The size of the spacer is smaller than that which could be made by lithography, typically a fraction of one micron. A supplemental oxide deposition on the sides of the nitride forms an oxide nest with the nitride spacers within, in a sort of slot. When nitride is removed by an etching process, the nest is empty. The ability to etch a narrow nest or slot establishes the small dimension of the thin window to be formed in this space, rather than a reliance on photographic resolution in photolithography. Once the nitride spacer is removed, a layer of thin tunnel oxide is applied across the edge of the cell.

Where two cells are simultaneously formed in symmetric relation, the thin oxide can extend past the edge of the cell, across the edge of an adjacent cell and into a region formerly occupied by a dummy spacer in the adjacent cell. Such a thin oxide stripe, extending across two cells, does not interfere with the formation of the remainder of the two cells. For example, poly one is deposited across each cell and etched back to form a floating gate. Real nitride spacers may optionally be formed at edges of the poly one floating gate. Subsequent layers of oxide and poly two complete the cell structure. It should be noted that the real nitride spacers are not in the same position as the former dummy spacers, which have been lost to etching. The optional real spacers remain in place, protecting edges of the poly one floating gate from lateral mobile electron or ion migration into or out of the floating gate.

Select transistors may be formed simultaneously with EEPROM structures using selected layers and steps, such as the implantation step for source and drain formation, an oxide deposition step following nitride removal. This oxide deposition forms a gate oxide for the select transistor but forms an inter-poly oxide for the EEPROM devices. The oxide deposition is followed by poly-two layer deposition. The select and EEPROM transistors are now finished in the usual way.

DESCRIPTION OF PREFERRED EMBODIMENT

Figure 1:
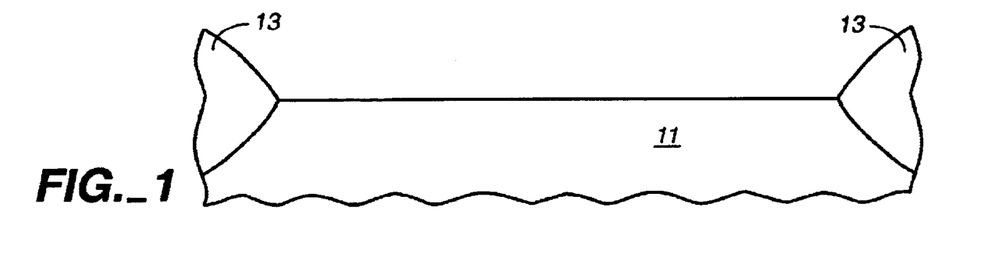
FIGS. 1–18 are side elevational views of a CMOS memory device of the present invention in progressive steps of the device fabrication process.

With reference to FIG. 1, a substrate 11 may be of either conductivity type, e.g. p-type. The substrate has field oxide regions 13 which form isolation barriers defining active regions of the device. Semi-recessed silicon dioxide partially diffused LOCOS structures are shown, but other isolation and techniques may be combined or substituted, including implant regions.

Figure 2:
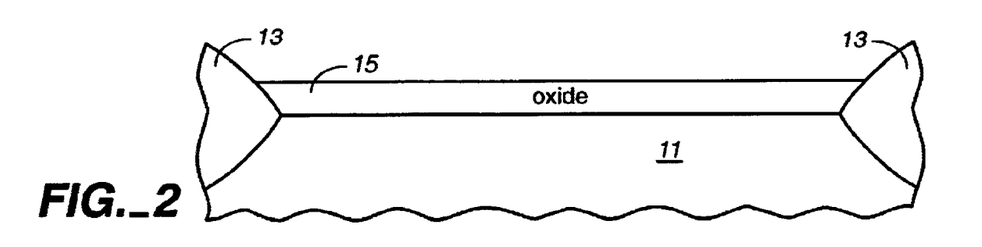

In FIG. 2, a silicon dioxide layer 15 is thermally grown on the active areas of the surface of substrate 11 to a thickness of approximately 350 Å, forming a gate oxide layer. The layer extends completely across the substrate, contacting the field oxide regions 13.

Figure 3:
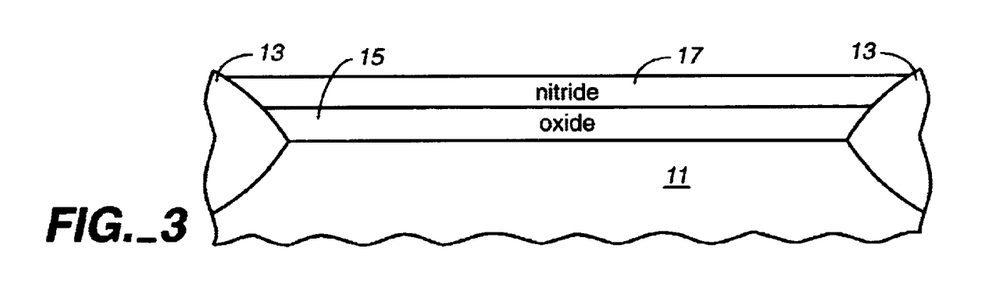

In FIG. 3, a nitride layer 17 is seen to be deposited over the gate oxide layer 15 in the active areas to a typical thickness of 1500 Å. The nitride layer may be grown by chemical vapor deposition and extends across the device covering oxide layer 15 and contacting field oxide isolation regions 13.

Figure 4:
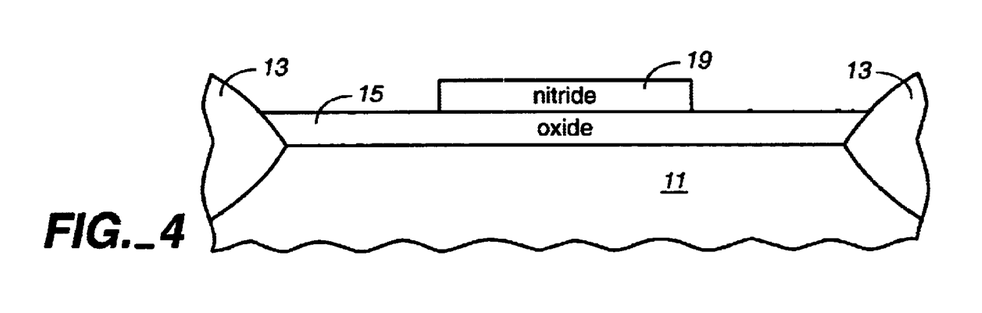

In FIG. 4, the nitride layer 17 is etched to leave a nitride implant mask 19 protecting a region in substrate 11 which will become the channel of the memory transistor. Etching of the nitride can be carried out by means of wet chemical etching.

Figure 5:
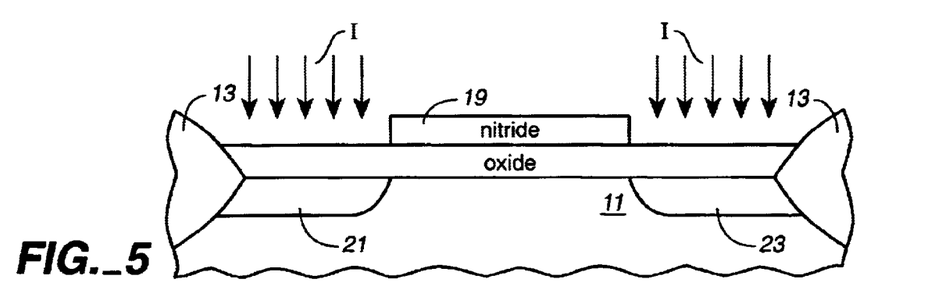

In FIG. 5, ion implantation for buried implant is represented by arrows I. The nitride mask 19 blocks ions from channel regions directly below, but ions pass along the lateral sides of the nitride mask 19 forming buried implant regions 21 and 23, respectively. After ion implantation, the device is annealed at a temperature of 700° C. to eliminate small crystalline defects and stresses in the layered structure.

Figure 6:
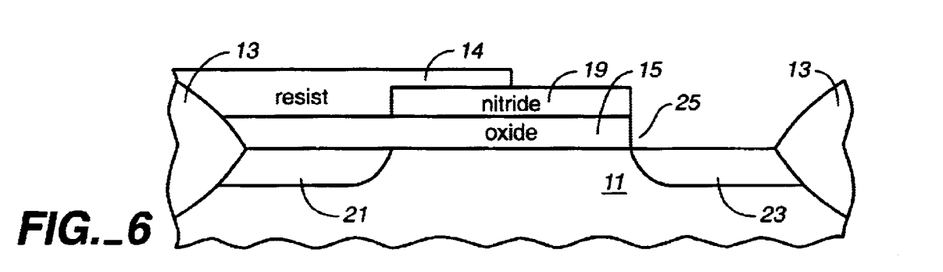

In FIG. 6, a resist layer 14 protects the left side of oxide layer 15 while a region 25 of oxide layer 15 is removed from the right edge of the nitride mask layer 19 extending to the field oxide 13. The region 25 may be removed by reactive ion etching, with only the oxide on one side of the nitride mask being removed. The resist layer 14 is then removed.

Figure 7:
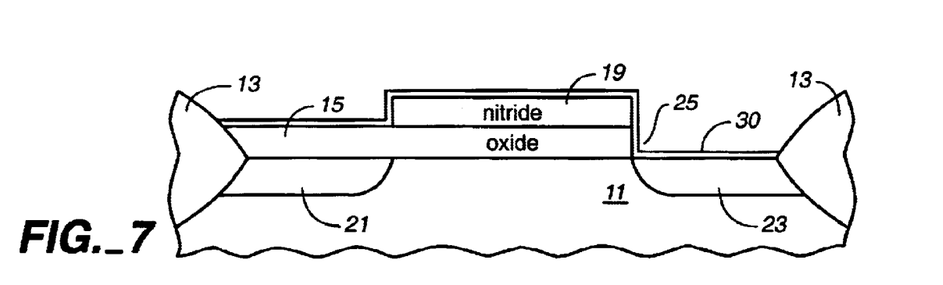

In FIG. 7, a very thin oxide layer 30, approximately 80 Å, is deposited on substrate 11 in the removed region 25. This thin oxide layer, deposited by chemical vapor deposition, may also exist elsewhere on the wafer but is of no consequence elsewhere.

Figure 8:
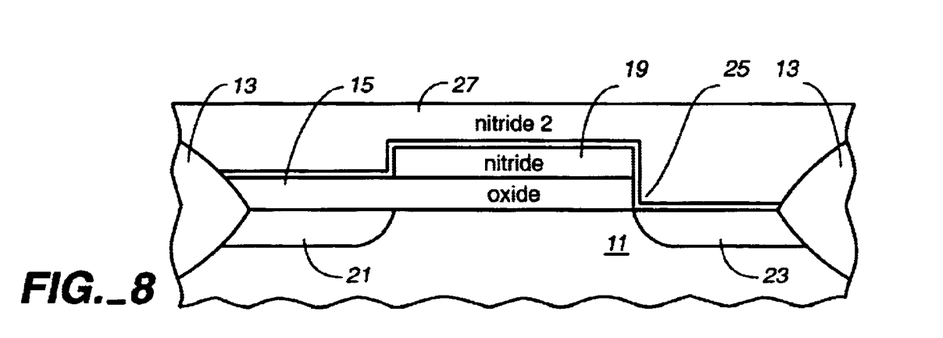
Figure 9:
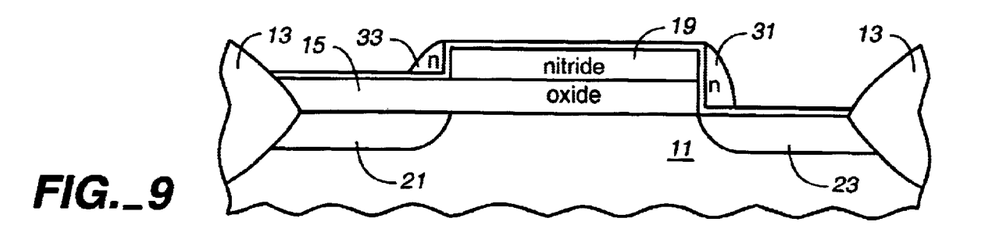

In FIG. 8, a second nitride layer 27 is deposited across the device covering field oxide regions 13 at opposite edges. The second nitride layer is approximately 1,500 Å thick. Later, the nitride layer is etched, as seen in FIG. 9, to leave dummy nitride spacers 31 and 33 on either side of the nitride mask 19. The size of spacer 31 defines the size of a future tunnel oxide region. The spacers 31 and 33 appear to be similar to spacers used on opposed sides of the gate of a transistor, but these are much thinner and will subsequently be lost and so are termed "dummy" spacers. Note that the dummy spacer 31 resides atop the thin oxide layer previously deposited in the space created by reactive ion etching. The footprint of the dummy spacer 31 corresponds to the dimension of a tunnel oxide window which will be subsequently created.

Figure 10:
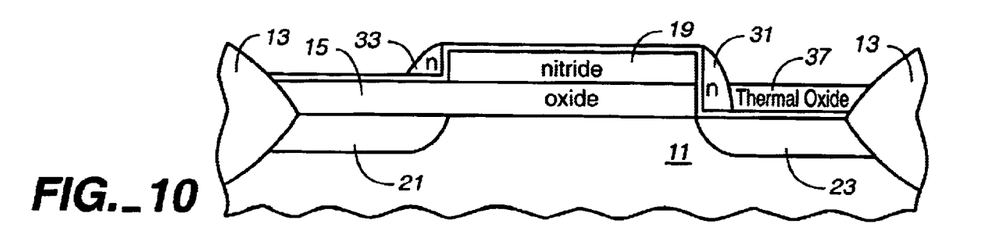

As shown in FIG. 10, a layer of thermal oxide 37 is deposited outside of the nitride layers. The thickness of the thermal oxide layer is approximately 350 Å. The purpose of this layer is to thicken the oxide on the right side of the nitride mask, forming a "nest" in which dummy spacer 31 resides.

Figure 11:
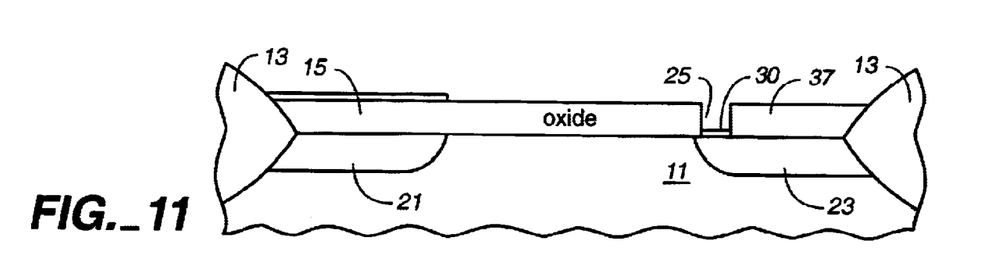

In FIG. 11, the nitride layers a seen to be removed. A short oxide etch, thinning the thermal oxide layer 37, is followed by a wet nitride etch removing the nitride mask 19 and the dummy nitride spacers 31 and 33.

In FIG. 11, the thin oxide layer 30 remains in the open region 25 above drain 23. Gate oxide layer 15 also remains intact after the removal of he nitride.

Figure 12:
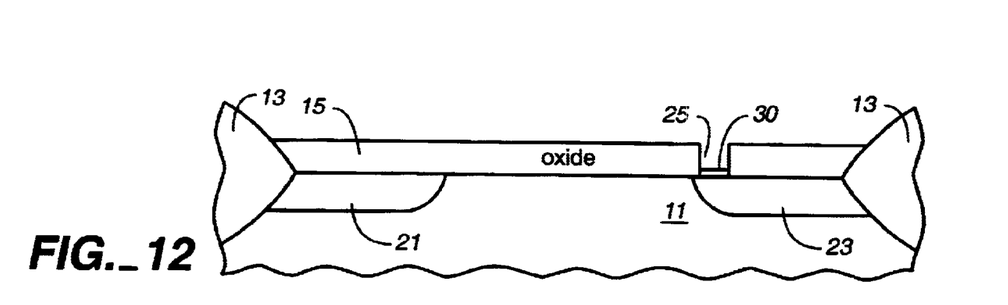
Figure 13:
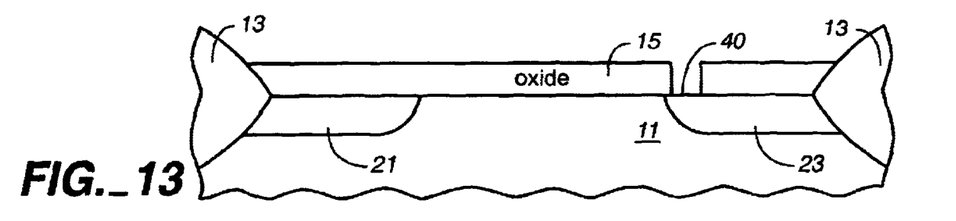

In FIG. 12, the thin oxide layer 30 is seen to be removed in a wet oxide etch, and then, in FIG. 13, a tunnel oxide layer 40 is grown to a thickness of approximately 70 Å. The tunnel oxide layer in region 25 is referred to as a tunnel oxide window immediately over implant 23. Note how this window has be n formed without photolithography. The narrow length of he window is less than one angstrom. An empty spacer nest has been created in the space formerly occupied b spacer 31.

Figure 14:
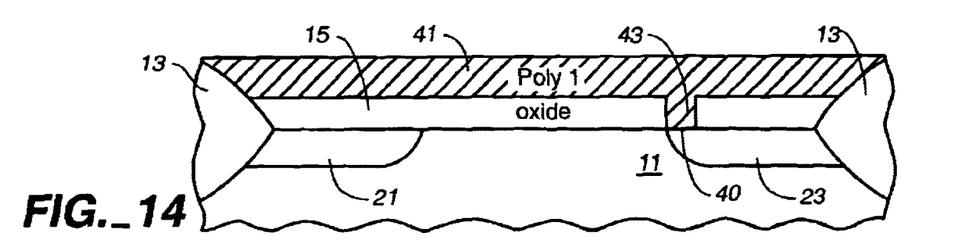

In FIG. 14, a first conductive polysilicon layer 41 is deposited over oxide layer 5, forming a poly-one layer. A portion of this layer dips down toward the substrate and contacts the thin oxide window 40 over drain 23 occupying the spacer nest. The dip down region 43 will form a path for electrons into the upper portion of the poly-one layer, i.e. the floating gate.

Figure 15:
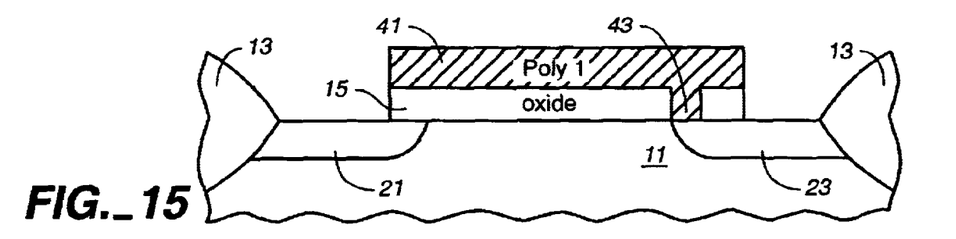

In FIG. 15, the poly-one layer 41 and underlying oxide layer 15 are seen to be etched so that portions of the oxide extend over the implant regions 21 and 23 respectively. Charge can flow from an implant region, after further implantation to become a drain electrode, through the tunnel oxide window appearing in the dip down region 43 of the polysilicon gate 41.

Figure 16:
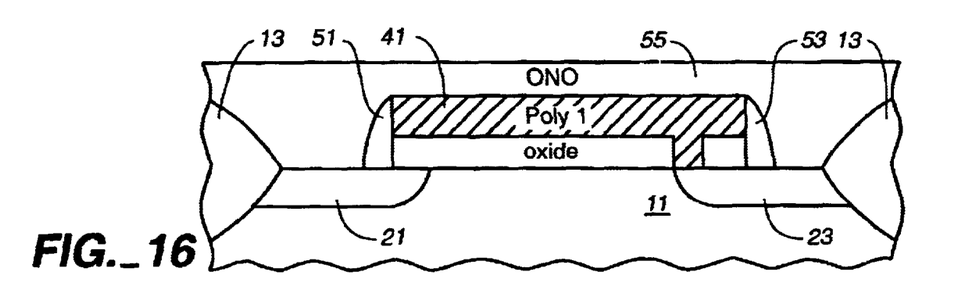

In FIG. 16, optional nitride spacers 51 and 53 may be disposed on either side of the polysilicon gate 41. Formation of such spacers is known and the spacers serve to limit or preclude mobile ions or stray charge from entering the poly-one floating gate through its sides. An ONO or interpoly dielectric layer a typical thickness of 350 Å, is placed over the poly-one layer.

Figure 17:
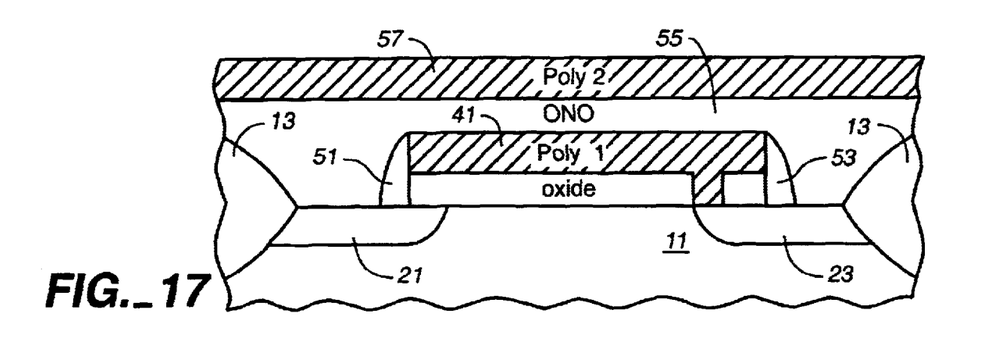
Figure 18:
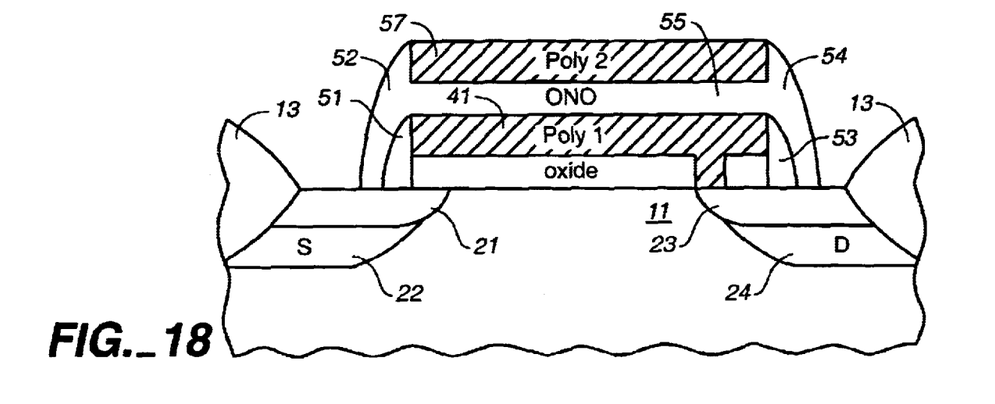

In FIG. 17, a second conductive polysilicon layer called control poly, poly-two layer 57, is seen to be disposed over the interpoly dielectric layer, layer 55 and the nitride spacers 51 and 53. The poly-two layer 57 is parallel and spaced apart from the poly-one layer 41. In FIG. 18, the upper layers 55 and 57 are etched leaving the poly-two layer 57 over the layer 41. The optional nitride spacers 51 and 53 remain as protective barriers for the poly-one layer and its underlying oxide layer. Source and drain implants 22 and 24 may be made using the ONO layer as a self-alignment tool. The source and drain implants 22 and 24 have greater dopant concentration and energy than implants 21 and 23. Further nitride spacers 52 and 54 optionally protect the poly-two layer 57.

Figure 19:
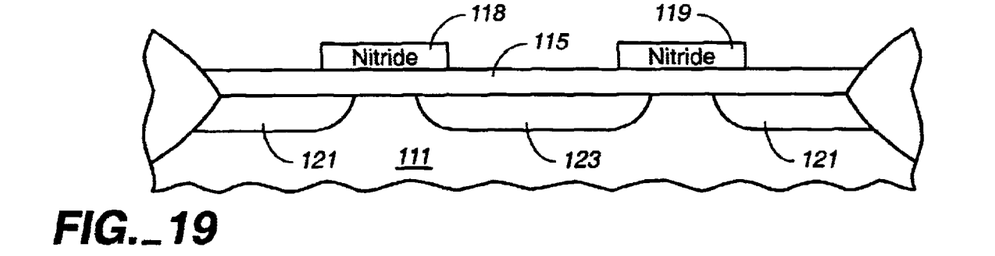
FIGS. 19–23 are side elevational views of laterally symmetric CMOS memory devices, similar to the device illustrated in FIGS. 1–18, in progressive steps of the device fabrication process.

In FIG. 19, the formation of twin symmetric CMOS devices of the same kind and conductivity is shown. A substrate is prepared as in the prior embodiment. Note that several steps of the prior embodiment are combined into single steps. In FIG. 19, an oxide layer 115 is deposited on doped substrate 111. Next, a nitride layer is deposited on the oxide layer, with the oxide and nitride layers having the same thicknesses as previously described in the prior embodiment. The nitride layer is etched to make nitride masks 118 and 119 which serve for protecting the channel region after formation of sources 121 and drain 123 by ion implantation using the nitride masks 118 and 119 for self-alignment.

Figure 20:
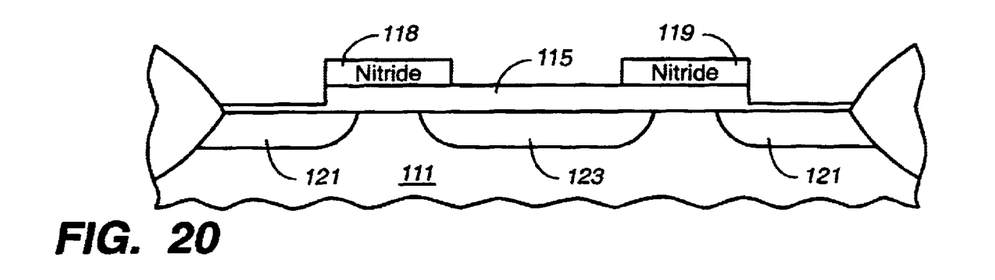
Figure 21:
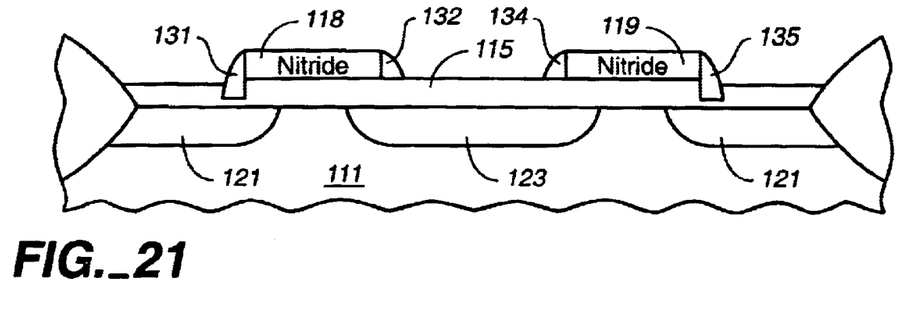
Figure 22:
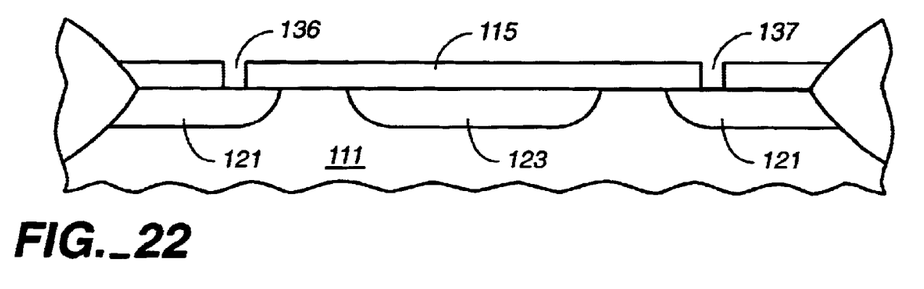

In FIG. 20, oxide is removed by etching from outer lateral edges of the nitride masks 118 and 119. Once oxide from layer 115 is removed, a thin oxide layer is regrown to a thickness of approximately 80 Å, corresponding to the growth shown in FIG. 7. The original oxide layer 115 exists at full height over the drain 123 and the channel regions on both sides of the drain. Next, a second layer of nitride is disposed over the entire active region, but then etched back to define spacers 131, 132, 134 and 135 seen in FIG. 21. These are the dummy spacers previously described with reference to FIG. 9. A thermal oxide layer is deposited over the sources, as previously described, with reference to FIG. 10 then etched back, leaving an approximately 350 Å layer of oxide over the sources 121. Next, all nitride is removed, as seen in FIG. 22, and the thin oxide beneath the spacers is replaced with a tunnel oxide layer in openings 136 and 137, corresponding to the description in FIGS. 11–13 above.

Figure 23:
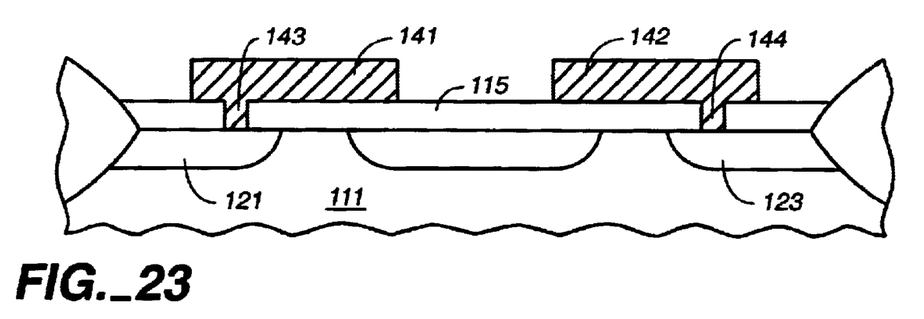

In FIG. 23, a first polysilicon layer is deposited over the oxide and etched back to form the floating gates 141 and 142. These floating gates have the dip down regions 143 and 144 in contact with the thin tunnel oxide immediately over the implant region 121, This allows electron communication from the source regions into the floating gates after further doping to make sources and a drain.

Figure 24:
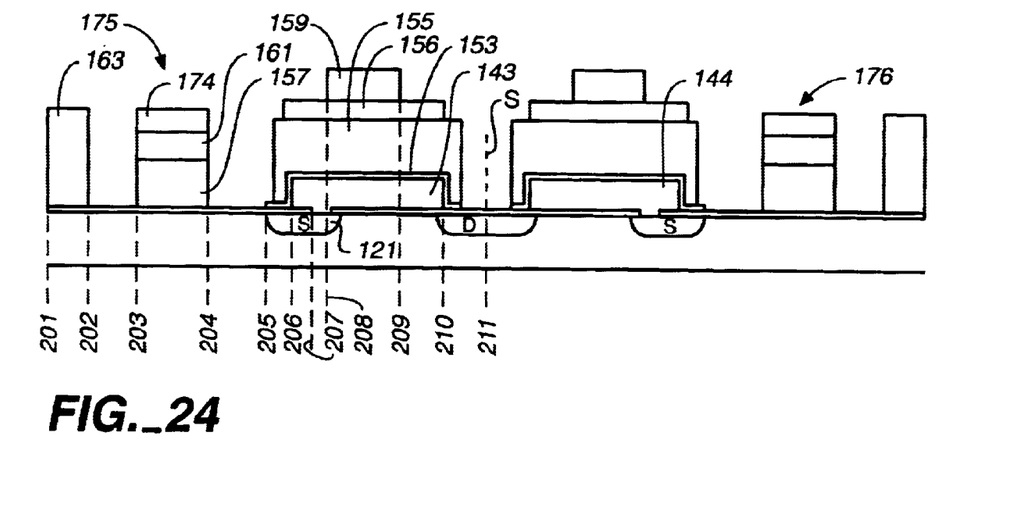
FIG. 24 is a side elevational view of laterally symmetric CMOS devices as in FIG. 23, with lateral sense transistors, forming a pair of memory cells.

In FIG. 24, a finished pair of select transistors 175 and 176 are seen to be symmetric about the floating gates 143 and 144. Each floating gate is covered by a layer of insulator 153, typically ONO (oxy-nitride-oxy), which in turn is covered by an oxide layer 155, followed by a second polysilicon layer 156, thereby forming the poly-two layer. The same polysilicon layer forms an electrode 161 for a select transistor 175 over oxide layer 157. A conductive layer 159 on the floating gate transistor allows for erasing or programming of a group of similar memory cells. Similarly, the poly-two layer 161 of the select transistor 175 residing over oxide layer 157, allows for erasing or programming of the associated memory cell transistor. A metal layer 174 over poly-two layer 161 provides for communication with a group of select transistors. A contact 163 may be placed at an edge of a transistor pair as an electrode for the select transistor, communicating with the source or drain of the select transistor. If the metal layer 159 is a word line, the contact 163 can be a bit-line.

Figure 25:
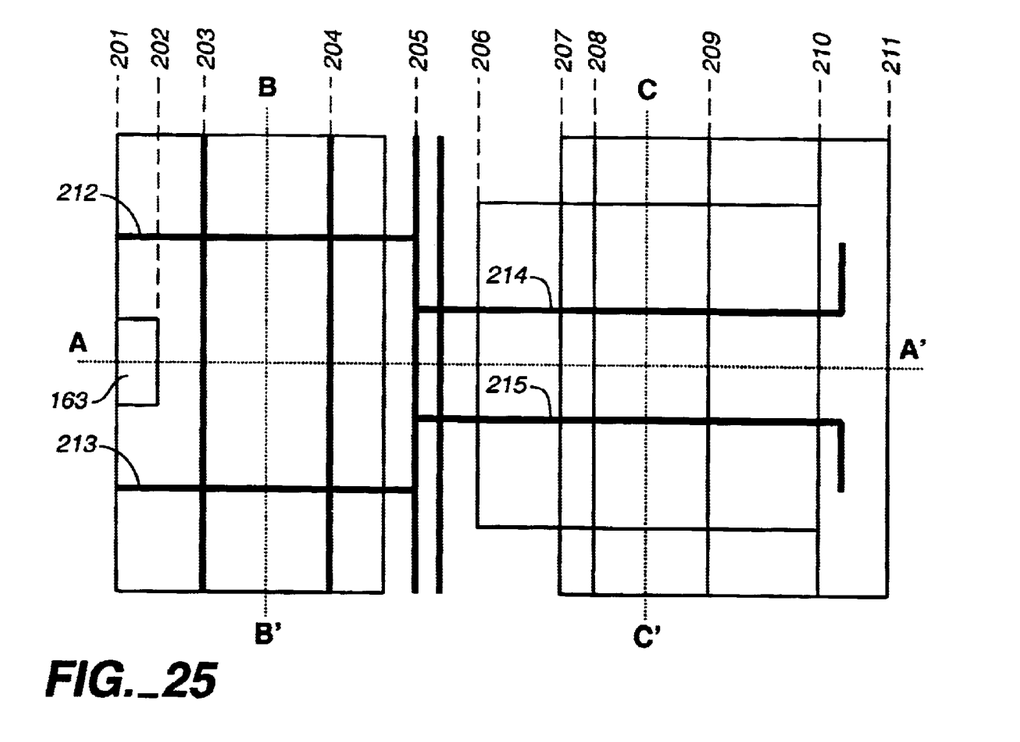
FIG. 25 is a top plan view of a single memory cell shown in FIG. 24, with FIG. 24 being taken along lines A–A' in FIG. 25.

In FIG. 25, the various regions are represented in a top view with lines 201-211 corresponding to similar dashed lines in the left hand side memory transistor of FIG. 24. Pairs of lines 201 and 202 indicate the contact region 163. The lines 203 and 204 correspond to opposite edges of conductive layer 161. The dark lines 212 and 213 define boundaries of the active region, as do the heavy lines 214 and 215. Line 205 indicates the approximate beginning of source 121 in the left hand side transistor. The pairs of lines 206 and 210 indicate the extent of the poly-one layer. The pairs of lines 207 and 208 indicate the length of the tunnel oxide. Lines 208 and 209 correspond to the extent of the conductive electrode 159. Line 210 indicates the right-most end of the poly-one layer while line 211 indicates the right-most extent of the thin oxide.

Figure 26:
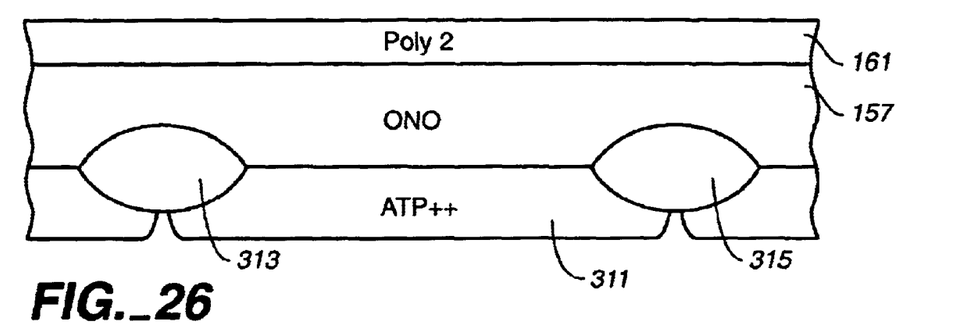
FIG. 26 is a cross sectional view of the memory cell of FIG. 25 taken along lines B–B'.

In FIG. 26, the construction of the select transistors may be seen. Source and drain regions, not seen in this section, are formed in the substrate having an anti-punch through (ATP) layer between field oxide regions 313 and 315. These field oxide regions form the boundary of the select transistor. Over the substrate is a thick oxide layer 157 which may also be seen in FIG. 24. Above this oxide layer is a poly-two layer 161 which runs across the top of the transistor and exists between lines 203 and 204 in FIG. 25. Note that poly-one is not used in the select transistor.

Figure 27:
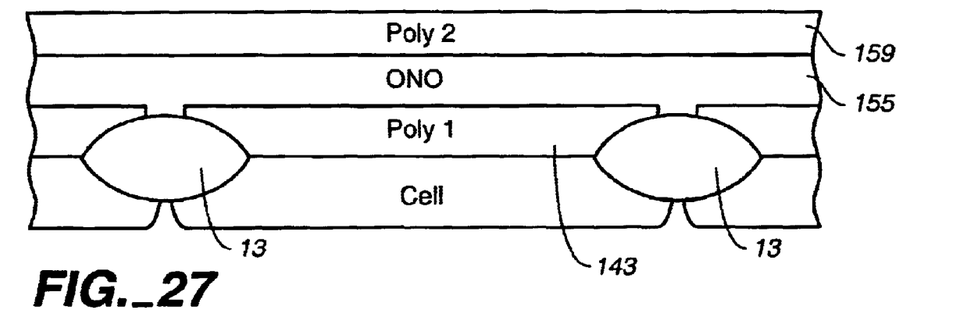
FIG. 27 is a cross sectional view of the memory cell of FIG. 25 taken along lines C–C'.

In FIG. 27, a section of the memory cell transistor, the poly-one layer 143 may be seen between field oxide regions 13, surrounding the device. Oxide layer 155, fabricated at the same time as oxide layer 157 in FIG. 26, resides over the poly-one layer 143. Poly-two layer 159 is above the thick oxide layer and may be seen in FIG. 24. Although FIGS. 26 and 27 show a device configuration between a pair of field oxide regions, construction is similar extending to the right and left involving other devices in an array of similar devices. Memory chips usually involve arrays of cells that are a number of bits wide by a number of words long. Since the oxide layers 151 and 157 are relatively thick, large voltages, such as 12 volts, may appear on poly-two control gates while much smaller voltages are typically used in connection with poly-one storage of electronic charge.

What is claimed is:

1. A method of making an EEPROM structure with a tiny thin window using process equipment having a characteristic minimum feature dimension comprising:

defining active regions of a substrate;

forming a nitride mask with defined edges in a layer over a gate oxide layer deposited upon an active substrate region for the EEPROM structure;

establishing buried implant regions in the active substrate region using defined edges of the nitride mask for source and drain self-alignment;

etching down along an edge of the nitride mask and through the gate oxide layer to proximity with the substrate, thereby forming a spacer nest with a floor over one of the source and drain regions;

forming a dummy nitride spacer on a side of the nitride mask in the spacer nest and resting on the floor of the nest, the nitride spacer adjacent to the nitride mask;

simultaneously removing both the nitride mask and the dummy nitride spacer, thereby opening the spacer nest;

depositing a layer of thin tunnel oxide across a portion of the substrate, including the floor of the spacer nest; and completing the EEPROM structure by depositing a poly one floating gate layer disposed over the gate oxide layer, the floating gate layer having a dip down region occupying the spacer nest above the thin tunnel oxide and by depositing a poly two control layer spaced from the poly one floating gate layer by an insulative layer, said one of the source and drain regions communicating electrical charge to the dip down region of the floating gate through the thin tunnel oxide.

2. The method of claim 1 wherein the spacer nest has a length less than the characteristic feature dimension of said process equipment.

3. The method of claim 1 wherein the source and drain regions are established by ion implantation.

4. The method of claim 1 wherein the nitride mask and gate oxide layer have thicknesses over the substrate, the thickness of the nitride mask layer exceeding the thickness of the gate oxide layer by a ratio of greater than 3 to 1.

5. The method of claim 1 further defined by depositing nitride spacers at lateral edges of the floating gate layer after formation of the floating gate.

6. A method of making an EEPROM structure with a thin window of tiny dimensions using process equipment having a characteristic minimum feature dimension comprising:

establishing a nitride mask over gate oxide on a substrate suitable for self-aligned source and drain electrode implantation;

implanting source and drain electrodes;

building dummy nitride spacers at lateral edges of the nitride mask, one of the spacers having proximity to one of the source and drain electrodes;

establishing an oxide layer around the nitride mask covering at least portions of the source and drain;

removing all nitride including the dummy spacers, thereby creating a spacer nest in place of oxide residing beneath the spacer having proximity to one of the source and drain electrodes;

depositing a very thin tunnel oxide layer at least in the spacer nest;

completing the EEPROM structure by depositing a poly one floating gate layer disposed over the gate oxide layer, the floating gate layer having a dip down region occupying the spacer nest above the thin tunnel oxide layer and by depositing a poly two control layer spaced apart from the poly one floating gate layer by an insulative layer, said one of the source and drain electrodes communicating electrical charge to the dip down region of the floating gate through the thin tunnel oxide.

7. The method of claim 6 further defined wherein the spacer nest of each of the EEPROM structures has a length less than the characteristic feature dimension of said process equipment.

8. The method of claim 6 wherein said dummy spacers are made from nitride material.

9. The method of claim 6 further defined by defining an active area with:field oxide regions and wherein the very thin tunnel oxide extends from a side of the dip down region of the poly-one layer to a field oxide region.

10. The method of claim 6 further defined by forming a select transistor simultaneous with the formation of the EEPROM structure, said select transistor being adjacent to the EEPROM structure.

11. A method of making twin symmetric EEPROM structures, each structure with a thin window of tiny dimensions using process equipment having a characteristic minimum feature dimension comprising:

establishing a nitride mask over each of two spaced apart gate oxide layers on a substrate suitable for self-aligned source and drain electrode implantation to define two EEPROM structures;

implanting source and drain electrodes in each EEPROM structure;

building dummy nitride spacers at lateral edges of the nitride masks, one of each of the spacer pairs having proximity to one of the source and drain electrodes;

establishing an oxide layer around the nitride mask covering at least portions of the source and drain;

removing all nitride including the dummy spacers, thereby creating a spacer nest in place of oxide residing beneath the spacer having proximity to one of the source and drain electrodes;

depositing a very thin tunnel oxide layer at least in the spacer nest; and completing the EEPROM structures by depositing a poly one floating gate layer disposed over the gate oxide layer, each of the floating gate layers having a dip down region occupying the spacer nest above the thin tunnel oxide layer and by depositing a poly two control layer spaced from the poly one floating gate layer by an insulative layer, said one of the source and drain electrodes communicating electrical charge to the dip down region of the floating gates of the EEPROM structures through the thin tunnel oxide.

12. The method of claim 11 further defined by forming opposed pairs of select transistors simultaneous with the formation of the EEPROM structures, each of said select transistors being adjacent to one of the EEPROM structures.

* * * * *